US006974732B2

(12) United States Patent
Ohtani et al.

(10) Patent No.: US 6,974,732 B2
(45) Date of Patent: *Dec. 13, 2005

(54) SEMICONDUCTOR DEVICE METHOD OF MANUFACTURING

(75) Inventors: Hisashi Ohtani, Atsugi (JP); Tamae Takano, Atsugi (JP); Chiho Kokubo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/656,239

(22) Filed: Sep. 8, 2003

(65) Prior Publication Data
US 2004/0058486 A1 Mar. 25, 2004

Related U.S. Application Data

(62) Division of application No. 10/214,693, filed on Aug. 9, 2002, now abandoned, which is a division of application No. 09/120,244, filed on Jul. 22, 1998, now Pat. No. 6,432,756.

(30) Foreign Application Priority Data

Jul. 24, 1997 (JP) .............................................. 9-216002
Jun. 1, 1998 (JP) ........................................... 10-151543

(51) Int. Cl.[7] .............................................. H01L 21/00
(52) U.S. Cl. ........................ 438/166; 438/151; 438/158
(58) Field of Search ................................ 438/151–166, 438/486–487

(56) References Cited

U.S. PATENT DOCUMENTS

| | | | |
|---|---|---|---|
| 5,403,772 A | 4/1995 | Zhang et al. | |
| 5,426,064 A | 6/1995 | Zhang et al. | |
| 5,481,121 A | 1/1996 | Zhang et al. | |
| 5,488,000 A | 1/1996 | Zhang et al. | |
| 5,492,843 A | 2/1996 | Adachi et al. | |
| 5,501,989 A | 3/1996 | Takayama et al. | |
| 5,508,533 A | 4/1996 | Takemura | |
| 5,529,937 A | 6/1996 | Zhang et al. | |
| 5,534,716 A | 7/1996 | Takemura | |
| 5,543,352 A | 8/1996 | Ohtani et al. | |
| 5,563,426 A | 10/1996 | Zhang et al. | |
| 5,569,610 A | 10/1996 | Zhang et al. | |
| 5,569,936 A | 10/1996 | Zhang et al. | |
| 5,580,792 A | 12/1996 | Zhang et al. | |
| 5,585,291 A | 12/1996 | Ohtani et al. | |
| 5,589,694 A | 12/1996 | Takayama et al. | |
| 5,595,923 A | 1/1997 | Zhang et al. | |

(Continued)

FOREIGN PATENT DOCUMENTS

JP          09-045616          2/1997

OTHER PUBLICATIONS

Wong et al., Characterization of the MIC/MILC Interface and Its Effects on the Performance of MILC Thin–Film Transistors, (IEEE), pp. 1061–1067, May 2000.

Lee et al., Fabrication of High Mobility p–channel poly–si TFTs by self aligned MILC, (IEEE), pp. 407–409, 1996.

*Primary Examiner*—Dung A. Le
(74) *Attorney, Agent, or Firm*—Eric J. Robinson; Robinson Intellectual Property Law Office, P.C.

(57) ABSTRACT

To effectively crystallize an amorphous semiconductor film comprising silicon by utilizing nickel element and remove nickel element contributed to the crystallization, a mask 103 is provided on an amorphous silicon film 102, oxide film patterns 107 and 108 including nickel are formed, phosphorus is doped in a region 109, thereafter, heating is performed, nickel element is diffused via paths 110 and 111 and nickel element diffuses in the amorphous silicon film and gettered by phosphorus at the region 109 by which crystallization of diffusion of nickel and gettering of nickel can be carried out simultaneously.

20 Claims, 5 Drawing Sheets

U.S. PATENT DOCUMENTS

| | | |
|---|---|---|
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kasumoto et al. |
| 5,663,077 A | 9/1997 | Adachi et al. |
| 5,677,549 A | 10/1997 | Takayama et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,824 A | 4/1998 | Kousai et al. |
| 5,789,284 A | 8/1998 | Yamazaki et al. |
| 5,830,784 A | 11/1998 | Zhang et al. |
| 5,843,225 A | 12/1998 | Takayama et al. |
| 5,869,363 A | 2/1999 | Yamazaki et al. |
| 5,888,857 A | 3/1999 | Zhang et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,949,115 A | 9/1999 | Yamazaki et al. |
| 5,956,579 A | 9/1999 | Yamazaki et al. |
| 5,961,743 A | 10/1999 | Yamazaki et al. |
| 5,977,559 A | 11/1999 | Zhang et al. |
| 5,985,740 A | 11/1999 | Yamazaki et al. |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,084,247 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,121,660 A | 9/2000 | Yamazaki et al. |
| 6,133,075 A | 10/2000 | Yamazaki et al. |
| 6,156,590 A | 12/2000 | Yamazaki et al. |
| 6,165,824 A | 12/2000 | Takano et al. |
| 6,168,980 B1 | 1/2001 | Yamazaki et al. |
| 6,194,255 B1 | 2/2001 | Hiroki et al. |
| 6,232,205 B1 | 5/2001 | Ohtani |
| 6,303,415 B1 | 10/2001 | Yamazaki |
| 6,310,363 B1 | 10/2001 | Ohnuma et al. |
| 6,316,789 B1 | 11/2001 | Yamazaki et al. |
| 6,331,457 B1 | 12/2001 | Yamazaki et al. |
| 6,355,509 B1 | 3/2002 | Yamazaki |
| 6,368,904 B1 | 4/2002 | Yamazaki |
| 6,399,454 B1 | 6/2002 | Yamazaki |
| 6,413,805 B1 | 7/2002 | Zhang et al. |
| 6,432,756 B1 | 8/2002 | Ohtani et al. |
| 6,433,363 B1 | 8/2002 | Yamazaki et al. |
| 6,465,288 B1 * | 10/2002 | Ohnuma .................. 4383/166 |
| 6,475,840 B1 | 11/2002 | Miyanaga et al. |
| 6,479,333 B1 | 11/2002 | Takano et al. |
| 6,489,189 B2 | 12/2002 | Yamazaki et al. |
| 6,544,826 B1 | 4/2003 | Yamazaki et al. |
| 6,551,907 B2 | 4/2003 | Ohtani |
| 6,830,617 B1 | 12/2004 | Ohtani et al. |
| 2005/0037554 A1 | 2/2005 | Ohtani et al. |

\* cited by examiner

SEMICONDUCTOR DEVICE METHOD OF MANUFACTURING

This application is a Div of Ser. No. 10/214,693 Aug. 9, 2002 now abandoned which is a Div of Ser. No. 09/120,244 Jul. 22, 1998 U.S. Pat. No. 6,432,756.

BACKGROUND OF THE INVENTION

1. Field of the Invention

The present invention disclosed in the specification relates to a method of fabricating a thin film transistor using a crystalline semiconductor film.

2. Description of Related Art

Conventionally, there has been known a thin film transistor (hereinafter, referred to as TFT) using an amorphous silicon film. The transistor is utilized mainly for constituting an active matrix circuit of a liquid crystal display device of an active matrix type.

However, according to TFT using an amorphous silicon film, there poses a problem where the operational speed is retarded and a P-channel type one cannot be reduced to practice.

The transistor cannot be used in a liquid crystal display device of an active matrix type integrated with a peripheral drive circuit and various integrated circuits cannot be constituted by using such TFT because of such a problem.

There has been known a constitution using a crystalline silicon film as means for resolving the problem.

As methods of fabricating a crystalline silicon film, there are classified roughly into a method by heating and a method by irradiation of laser beam.

According to the method by heating, there poses a problem where a glass substrate cannot be utilized since a process at a high temperature as high as 900° C. or higher is needed.

In consideration of the fact that a major field of application of TFT is a liquid crystal display device, capability of utilizing a glass substrate as a substrate constitutes a problem with priority.

Meanwhile, according to the method by irradiation of laser beam, although a process in which a substrate does not undergo thermal damage can be realized, the process is not satisfactory in view of uniformity and reproducibility of crystallinity and a degree of crystallinity of the semiconductor film.

As a means for resolving such a problem, there has been a method of accelerating crystallization by using a predetermined catalyst element which is the invention of the applicant.

According to the method, a catalyst element represented by nickel is introduced into an amorphous silicon film and a crystalline silicon film is provided later by a heating treatment.

According to the method, a crystalline silicon film having excellent crystallinity can be provided by a heating treatment at about 600° C. or lower in which a glass substrate can be utilized.

However, nickel element remains in the crystalline silicon film by which adverse influence is effected on properties of TFT fabricated thereby.

Specifically, there poses a problem of aging change of the properties, deterioration in reliability or the like.

SUMMARY OF THE INVENTION

It is an object of the present invention disclosed in the specification to provide a technology in which in respect of TFT fabricated by using a crystalline semiconductor film obtained by utilizing a catalyst element promoting crystallization of semiconductor, adverse influence of the catalyst element is prevented from effecting on properties of TFT.

According to one aspect of the present invention disclosed in the specification, there is provided a method of fabricating a semiconductor device comprising the steps of making crystals grow from a region at a portion of an amorphous silicon film to other region thereof, the crystals growing in accordance with movement of a catalyst element promoting crystallization of semiconductor, making the catalyst element diffuse from the region of the portion of the amorphous silicon film, and gettering the catalyst element at the other region.

According to another aspect of the present invention, there is provided a method of fabricating a semiconductor device comprising the steps of making crystals grow from a region of a portion of an amorphous silicon film to other region thereof, the crystals growing in accordance with movement of a catalyst element promoting crystallization of semiconductor, and making the catalyst element diffuse from the region of the portion of the amorphous silicon film and gettering the catalyst element at the other region simultaneously.

According to another aspect of the present invention, there is provided a method of fabricating a semiconductor device comprising the steps of making crystals grow from a region of a portion of an amorphous silicon film to other region thereof, the crystals growing in accordance with movement of a catalyst element promoting crystallization of semiconductor, an origin of the movement of the catalyst element is formed at the region of the portion of the amorphous silicon film, and a destination of the movement of the catalyst element is formed at the other region.

It is most preferable to use Ni as the catalyst element in the aspects of the present invention.

According to another aspect of the present invention, one or a plurality selected from the group consisting of Fe, Co, Ni, Ru, Rh, Pd, Os, Ir, Pt, Cu, Au, Ge, Pb and In can be used as the catalyst element.

In respect of the aspects of the present invention; the catalyst element is selectively added to or held in contact with the region of the portion of amorphous silicon film, and an element selected from the group consisting of P, As and Sb is selectively added to or held in contact with the other region.

An element selected from P, As and Sb is an element for gettering the catalyst element. As other element for gettering, N can be pointed out. In this signification, as an element for gettering, an element selected from elements of 15 group can be used.

According to the present invention disclosed in the specification, the highest effect can be achieved when nickel is selected as the catalyst element and P (phosphorus) is selected as the element for gettering.

As a method of introducing a catalyst element for promoting crystallization or a method of introducing an element for gettering, there can be used an ion implantation process, a diffusion process using a solution, a diffusion process using a solid, a process of diffusing the element from a film formed by a sputtering process or a CVD (Chemical Vapor Deposition) process, a plasma process, a gas adsorption process and so on.

Further, combination of these processes may be used. A selection of the processes may be carried out. For example, introduction of a catalyst element may be carried out by a process of using a solution, introduction of an element for gettering may be carried out by using a process by diffusion or the like.

DETAILED DESCRIPTION OF THE PREFERRED EMBODIMENTS

Figure 1A:
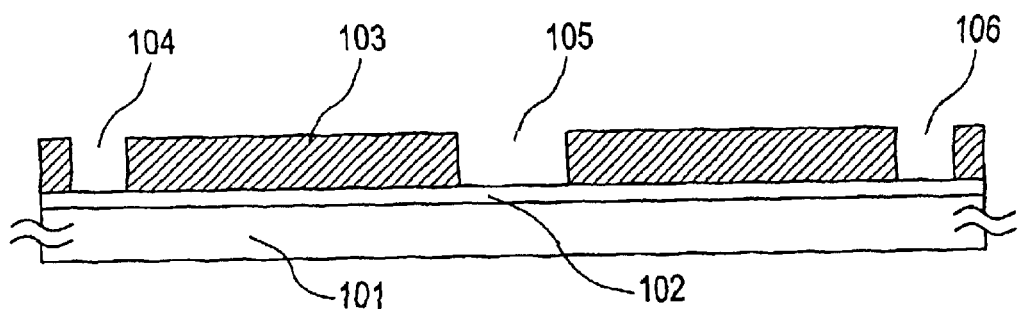
FIGS. 1A through 1E are views showing steps of fabricating TFT.

A specific example of the present invention is shown in FIGS. 1A through 1E.

According to an aspect of the present invention, there is provided a method of fabricating a semiconductor device comprising the steps of: making crystals grow from a region (region where openings 104 and 106 are formed) of an amorphous semiconductor film 102 to other region 109; the crystals growing in accordance with movement of a catalyst element promoting crystallization of the semiconductor film; wherein an origin of the movement of the catalyst element is formed at the region of the portion of the amorphous semiconductor film; and wherein a destination of the movement of the catalyst element is formed at the other region.

The crystal growth is carried out simultaneously with moving nickel element from silicon oxide film patterns 107 and 108 including nickel which are sources for diffusion of nickel to a region 109 doped with phosphorus which is a site for gettering nickel.

The constitution is featured in that diffusion of nickel and gettering of nickel are simultaneously carried out.

(Embodiments)

(Embodiment 1)

Fabrication steps of the embodiment are shown in FIGS. 1A through 1E and FIGS. 2A through 2C. First, an amorphous silicon film 102 is formed on a glass substrate 101 of Corning 1737 (strain point; 667° C.) by a low pressure thermal CVD process by a thickness of 50 nm.

As a method of fabricating the amorphous silicon film, a plasma CVD process can be used other than the low pressure thermal CVD process However, a concentration of included hydrogen which constitutes a hazard in crystallization is smaller in the case of a film formed by the low pressure thermal CVD process and accordingly, it is preferable to use the low pressure thermal CVD process when further excellent crystallinity or reproducibility is required.

When the amorphous silicon film 102 is formed, a mask 103 constituted by a silicon nitride film is formed. In this case, a silicon nitride film, not illustrated, is firstly formed by a plasma CVD process by a thickness of 250 nm. Further, a mask designated by numeral 103 is formed by patterning the film.

The mask 103 is formed with openings designated by numerals 104, 105 and 106. In this case, the openings 104 and 106 are for introducing nickel which is catalyst element for promoting crystallization of silicon. On the other hand, the opening 105 is for forming a site for gettering for removing nickel.

When a state illustrated in FIG. 1A is provided by arranging the mask 103, a silicon oxide film including nickel is successively formed. The silicon oxide film is formed by coating a coating solution for forming a silicon oxide-base film and heating it.

In this case, as a coating solution for forming a silicon oxide-base film, OCD (Ohka Coat Diffusion-Source) Type-1 (non-doping type) made by Tokyo Ohka Kogyo Co., Ltd. is used. Nickel is included in the OCD solution to constitute a concentration of 100 ppm in conversion of weight.

Figure 1B:
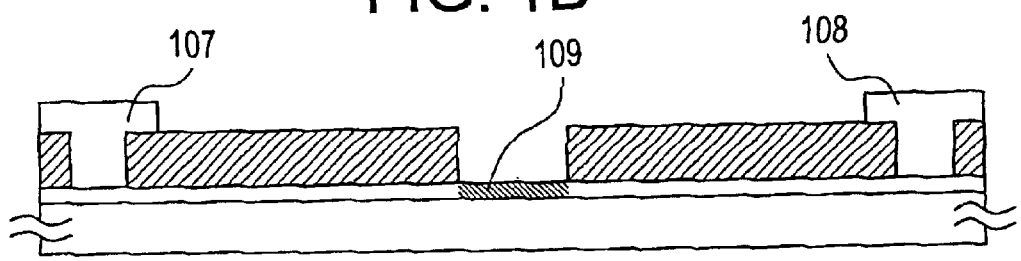

A film thickness of the silicon oxide film including nickel is set to 300 nm. When the silicon oxide film including nickel is formed, the film is patterned and patterns 107 and 108 of FIG. 1B are formed.

The patterns 107 and 108 of the silicon oxide film constitute sources for diffusion of nickel. A nickel thin film may directly be formed as sources for diffusion of nickel. Or, implantation of nickel ions may be carried out.

Next, doping of phosphorus is carried out by using a plasma doping process (or ion implantation process). In this step, phosphorus ions are shielded by the silicon oxide film patterns 107 and 108 and the mask patterns 103 comprising silicon nitride films and selectively doped to a region designated by numeral 109 in the amorphous silicon film 102. (FIG. 1B)

Although an example of introducing phosphorus by doping is shown in this example, for example, a PSG film or an amorphous silicon film including phosphorus may be formed and phosphorus may be held in contact with the region designated by numeral 109. As or Sb can be used in place of phosphorus.

Next, a heating treatment is carried out at 500° C. for 8 hours. In this step, nickel element is diffused from the silicon oxide film patterns 107 and 108 into the amorphous silicon film 102. Further, crystallization is progressed in accordance with diffusion of nickel.

On the other hand, in the region 109 where phosphorus is doped, nickel which has diffused is coupled with phosphorus and solidified there.

Phosphorus and nickel constitute a variety of coupling states and all of the coupling states are solid. Meanwhile, phosphorus does not diffuse in the silicon film unless at temperatures of 800° C. or higher.

Figure 1C:
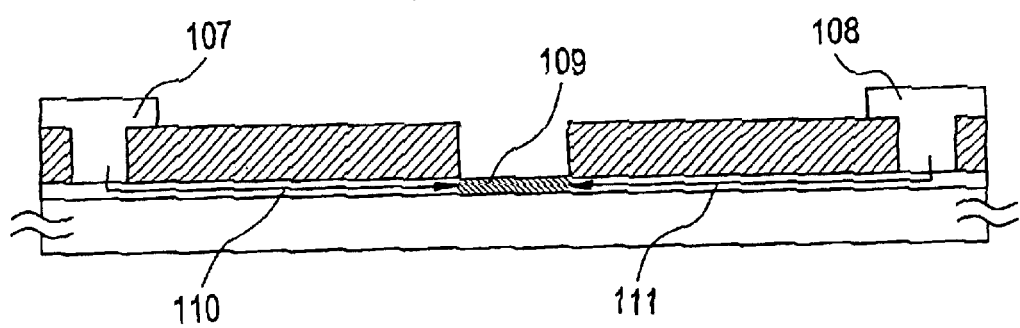

Viewing as a whole, nickel which has diffused via paths designated by numerals 110 and 111 of FIG. 1C is coupled with phosphorus at the region 109 and is fixed there.

Further, the amorphous silicon film 102 is crystallized in accordance with the diffusion of nickel. The crystallization is progressed by the paths designated by numerals 110 and 111 in FIG. 1C.

It is preferable to select heating temperature in the crystallizing step from a range of 450° C. through 800° C., preferably, 500° C. through 750° C.

When the heating temperature is lower than the temperature range, operation of crystallization in accordance with diffusion of nickel is reduced.

Further, when the heating temperature is higher than the temperature range, in addition to diffusion of nickel, an effect of diffusing phosphorus emerges and the effect of fixing nickel to a specific region is reduced.

The heating treatment in this case may generally be carried out by using a heating furnace having a heater of a resistor heating type. However, the heating may be carried out by irradiating infrared ray.

The crystal growth carried out by the paths designated by numerals 110 and 111 is singular which is carried out in a direction in parallel with the film face. The crystal growth is referred to particularly as lateral growth.

The laterally-grown region can be regarded as a region where crystallization is progressed when nickel is passing.

Further, the region can also be regarded as a region where nickel has passed through.

Almost no nickel remains in the region where the crystal growth has been carried out since nickel which has contributed to crystallization is fixed at the region 109.

That is, in respect of the region where the crystals have grown laterally, crystallization by diffusion of nickel and removal of nickel are simultaneously carried out.

When the step of crystallization shown in FIG. 1C has been finished, the silicon oxide film patterns 107 and 108 are removed. Further, the masks 103 comprising silicon nitride films are removed.

Figure 1D:
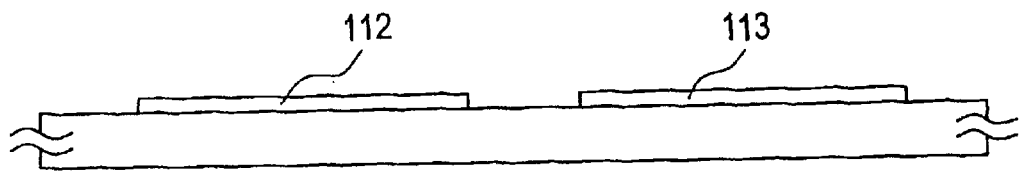

Further, the remaining silicon film is patterned and patterns designated by numerals 112 and 113 of FIG. 1D are formed. These patterns are formed by utilizing the regions where lateral growth of crystals has been carried out.

According to the embodiment, a pattern designated by numeral 112 constitutes an activation layer of TFT of P-channel type. Further, a pattern designated by numeral 113 constitutes an activation layer of TFT of an N-channel type.

Next, a silicon oxide film 114 for constituting a gate insulating film is formed by a plasma CVD process by a thickness of 100 nm. (FIG. 1E)

Figure 1E:
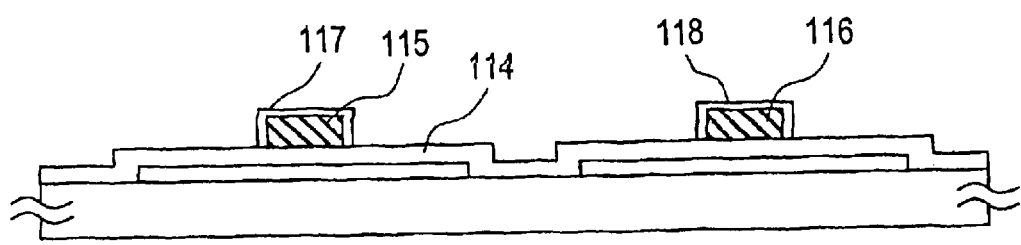

Next, an aluminum film, not illustrated, is formed by a thickness of 400 nm and the aluminum film is patterned by which patterns designated by numerals 115 and 116 of FIG. 1E are formed.

These aluminum patterns constitute gate electrodes of respective TFTs. Next, by carrying out anodic oxidation with the gate electrode patterns as anodes, anodized films 117 and 118 are formed. The film thickness of the anodized film is set to 70 nm. In this way, a state shown in FIG. 1E is provided.

The anodized film achieves an effect of restraining physically formation of projections referred to as hillocks or whiskers.

Figure 2A:
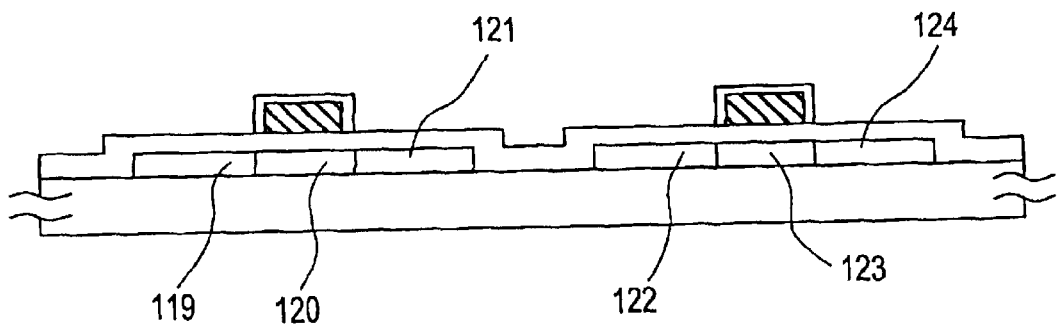
FIGS. 2A through 2C are views showing steps of fabricating TFT.

Next, doping of phosphorus over an entire region is carried out by using a plasma doping process. In this step, as shown in FIG. 2A, phosphorus is doped at regions 119, 121, 122 and 124 as shown in FIG. 2A. Further, doping is not carried out at regions 120 and 123.

Figure 2B:
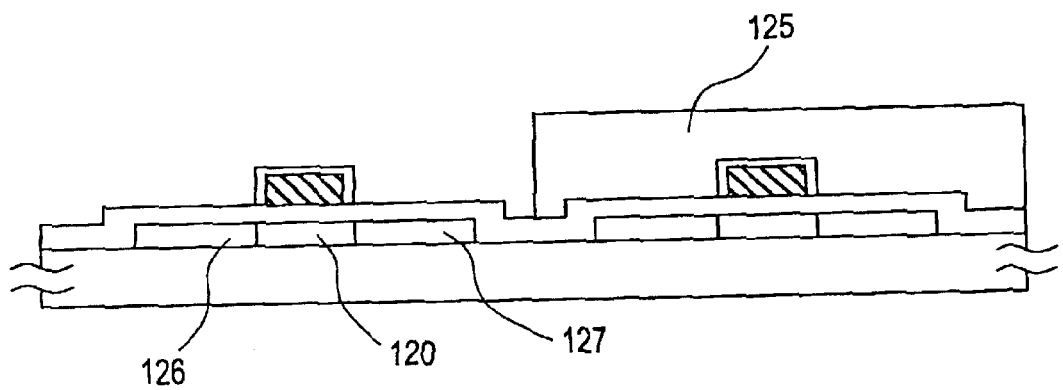

Next, a resist mask 125 is formed as shown in FIG. 2B. Further, at this occasion, doping of boron is carried out by a plasma doping process.

According to the step, the doping is carried out under a condition where an amount of dose is made larger than that in previous doping operation of phosphorus. Further, the conductive type of regions 126 and 127 is reverted.

In this way, the regions 122 and 124 of an N-type and the regions 126 and 127 of a P-type are formed.

The region 122 constitutes a drain region of TFT of an N-channel type. Further, the region 124 constitutes a source region of TFT of an N-channel type. Further, the region 123 constitutes a channel region of TFT of an N-channel type.

Further, the region 126 constitutes a source region of TFT of a P-channel type. Further, the region 127 constitutes a drain region of TFT of a P-channel type. Further, the region 120 constitutes a channel region of TFT of a P-channel type.

Figure 2C:
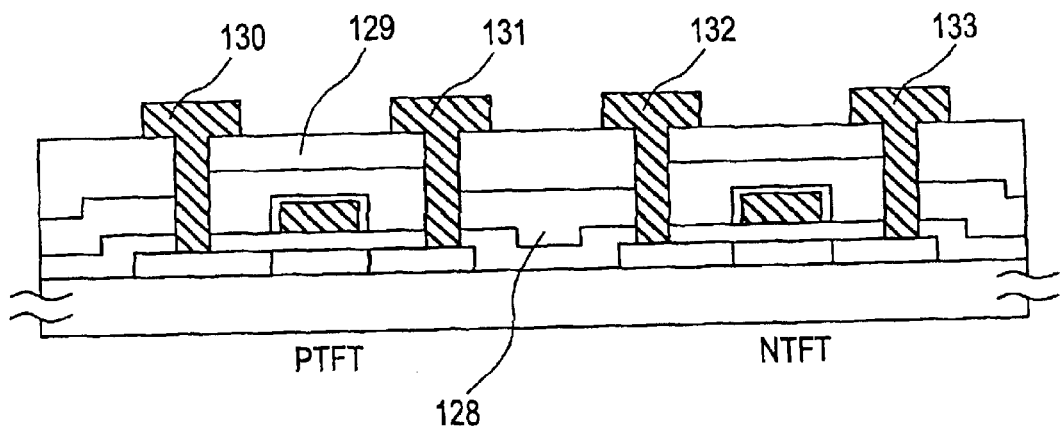

Next, as shown in FIG. 2C, a silicon nitride film 128 is formed as an interlayer insulating film by a plasma CVD process by a thickness of 250 nm. Further, an acrylic resin film 129 is formed as an interlayer insulating film. The film thickness of the acrylic resin film is set to 700 nm at a portion where it is minimized.

Acrylic resin is used since a surface thereof can be flattened. Other than acrylic resin, a material of polyimide, polyamide, polyimide amide, epoxy or the like can be used.

After forming the interlayer insulating films, contact holes are formed and a source electrode 130 and a drain electrode 131 of a P-channel type TFT (PTFT) are formed.

Further, a source electrode 133 and a drain electrode 132 of an N-channel type TFT (NTFT) are formed.

In this way, a P-channel type TFT and an N-channel type TFT can be fabricated by integrating them on the same substrate.

Although according to the embodiment, an example in the case where aluminum is used as gate electrode has been shown, the gate electrode can be constituted by using titanium or silicon material, or various silicide materials.

In this embodiment, an example of the case of a top gate type has been shown as the type of TFT. However, the present invention disclosed in the specification can be utilized also in TFT of a bottom gate type where the gate electrode is on the lower side (substrate side) of the activation layer.

In this case, the fabrication procedure is such that an amorphous film is formed after forming a gate electrode.

(Embodiment 2)

This embodiment shows an example where the solution of Embodiment 1 which includes nickel (Ni) as catalyst element for promoting crystallization of an amorphous silicon film is coated by a spin coating process.

FIGS. 3A through 3E show fabrication steps of the embodiment. First, similar to Embodiment 1, an amorphous silicon film 302 is formed on a glass substrate of Corning 1737 (strain point; 667° C.) 301 by a low pressure CVD process by a thickness of 50 nm.

When the amorphous silicon film 302 has been formed, in this case, a silicon oxide film, not illustrated, is firstly formed by a plasma CVD process by a thickness of 150 nm. Then, the film is patterned by which a silicon oxide film pattern designated by numeral 303 is formed.

The silicon oxide film pattern 303 is formed with openings designated by numerals 304 and 305. The openings 304 and 305 are for selecting regions for adding P (phosphorus) to remove nickel.

Figure 3A:
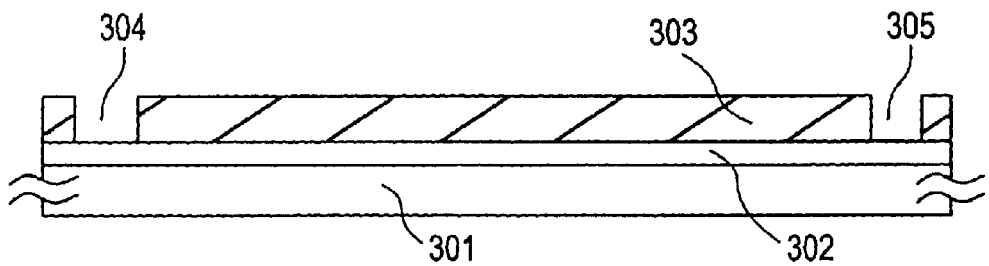
FIGS. 3A through 3E are views showing steps of fabricating TFT.

When the silicon oxide film pattern 303 has been arranged and a state shown in FIG. 3A is provided, addition of phosphorus is successively carried out by using a plasma doping process (or ion implantation process). In this step, phosphorus ions are shielded by the silicon oxide film pattern 303 and are selectively doped to regions designated by numerals 306 and 307 of the amorphous silicon film 302 from the openings 304 and 305 of the silicon oxide film pattern.

When doping of phosphorus has been carried out, the silicon oxide film pattern 303 is patterned again and an opening 308 is newly formed in addition to the openings 304 and 305.

The opening 308 is for introducing nickel which is catalyst element for promoting crystallization of the amorphous silicon film 302.

Figure 3B:
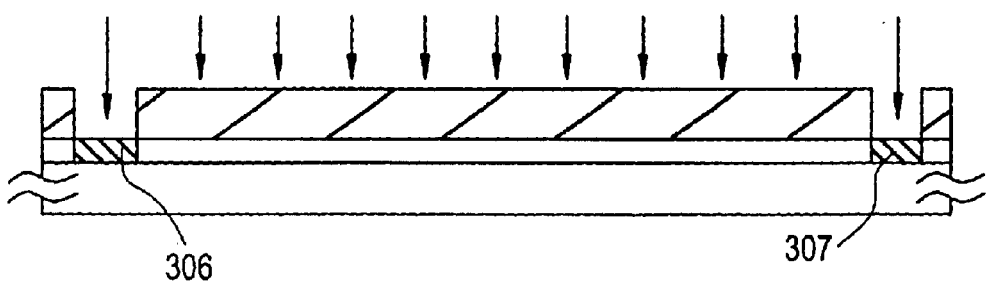
Figure 3C:
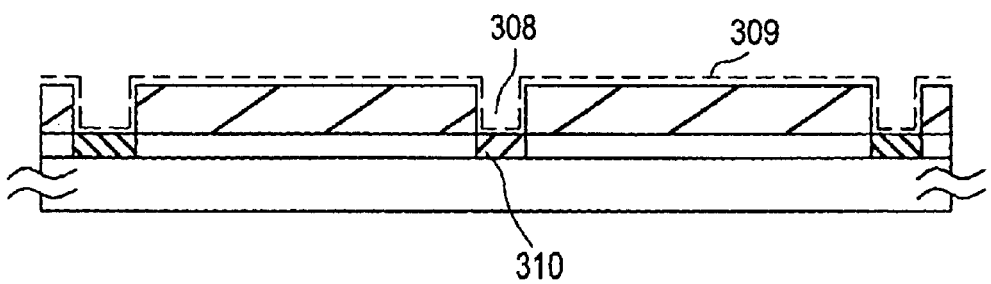

When the silicon oxide film pattern 303 having the openings 304, 305 and 308 has been arranged and a state shown in FIG. 3B is provided, a solution including nickel (10 ppm) is coated by a spin coating process and a layer 310 of a region including Ni is formed (FIG. 3C).

In gettering remaining nickel, it is preferable to set a condition where a concentration of phosphorus element is higher than a concentration of nickel. According to the embodiment, phosphorus element is set to remain with a concentration of about $1 \times 10^{20}$ atoms/cm$^3$ or more at minimum since the concentration of nickel remaining in the amorphous silicon film 302 is $1 \times 10^{19}$ atoms/cm$^3$ when the gettering step is not carried out.

When the step of adding catalyst element has been finished, crystallization of the amorphous silicon film 302 is carried out by performing a heating treatment at temperatures of 450 through 800° C. (representatively, 500 through 700° C.) for 4 through 24 hours in an inert atmosphere, a hydrogen atmosphere or an oxygen atmosphere. According to the embodiment, the heating treatment is carried out at 570° C. for 4 through 8 hours in a nitrogen atmosphere.

In this step, nickel diffuses from the region 310 into the amorphous silicon film 302. Further, crystallization is progressed in directions of arrow marks 311 and 312 of FIG. 3D in accordance with diffusion of nickel.

On the other hand, at the regions 306 and 307 where phosphorus is doped, diffused nickel is coupled with phosphorus and is solidified there.

Phosphorus and nickel are provided with a variety of coupling states and all of the coupling states are solid. When the heating temperature is lower than 450° C., operation of crystallization in accordance with diffusion of nickel is reduced.

Further, when the heating temperature is higher than 800° C., in addition to diffusion of nickel, an effect of diffusing phosphorus emerges and the effect of solidifying nickel at specific regions is reduced.

The heating treatment mentioned here may generally be carried out by using a heating furnace having a heater of a resistor heating type. However, the heating may be carried out by irradiating infrared ray.

According to the crystal growth which is carried out via the paths designated by numerals 311 and 312, similar to Embodiment 1, crystals are grown laterally.

Nickel which has contributed to crystallization is solidified concentratingly at the regions 306 and 307 and therefore, almost no nickel remains in the regions where the lateral growth has been carried out.

That is, in respect of the regions where lateral growth has been carried out, crystallization by diffusion of nickel and removal of nickel are simultaneously performed.

Figure 3D:
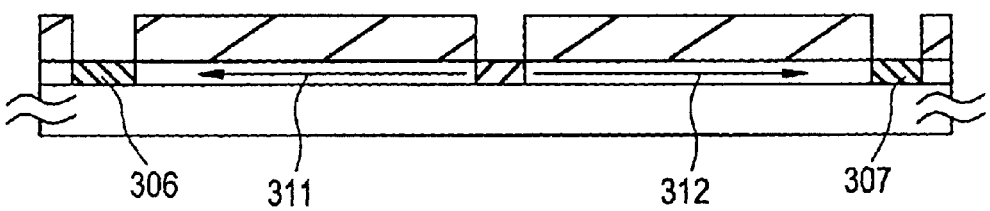

Therefore, viewing as a whole, nickel which has diffused via the paths designated by numerals 311 and 312 of FIG. 3D, is coupled with phosphorus at the regions 306 and 307 and is solidified there.

Further, by setting a condition where a concentration of adding phosphorus element is higher than a concentration of adding nickel to the amorphous silicon film 302 by one order or more, nickel added to the phosphorus adding regions 306 and 307 in FIG. 3D, is gettered in the phosphorus adding regions 306 and 307 without diffusing into the amorphous silicon film 302.

Figure 3E:
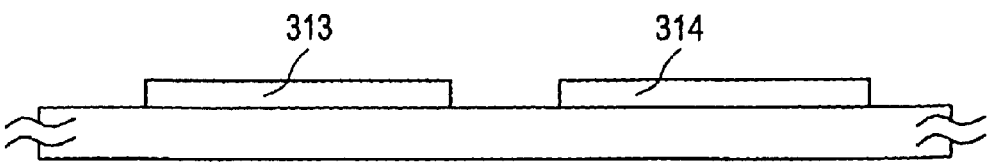

When the step of crystallization shown in FIG. 3D has been finished, the silicon oxide film pattern 303 is removed and the remaining silicon film is patterned by which patterns designated by numerals 313 and 314 of FIG. 3E are formed.

After patterning the silicon film, TFTs are fabricated in later steps in accordance with Embodiment 1 or other publicly-known process.

(Embodiment 3)

Figure 5:
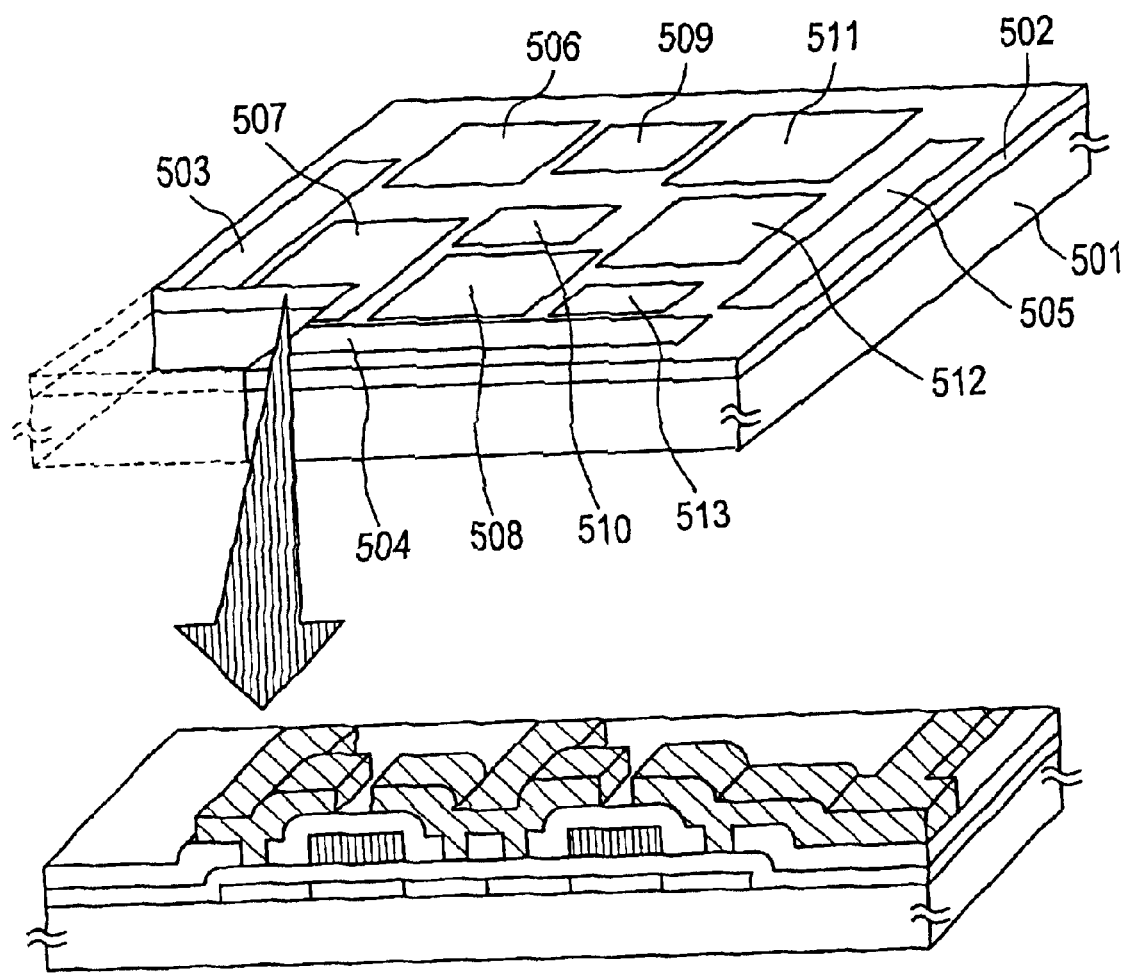
FIG. 5 is a view showing an outline of an integrated circuit using TFTs.

According to the embodiment, examples of various apparatuses utilizing TFTs are shown. FIG. 5 shows an example of a microprocessor of a semiconductor circuit utilizing TFTs and complementary TFT of N-type TFT and P-type TFT by enlarging a portion of the semiconductor circuit.

An insulating film 502 is formed on a ceramics substrate 501 and the substrate and elements are insulated and separated from each other. Further, there are formed on top thereof I/O ports 503 through 505, CPU 506, a cash memory 507, a cash address array 508, a multiplier 509, a circuit 510 including real time clock, serial interface, a timer and so on, a clock control circuit 511, a cash controller 512 and a bus controller 513.

The thin-film transistors disclosed in the specification can be utilized in various flat panel displays, information processing terminals having flat panel displays, a video camera and the like. According to the specification, these apparatuses are generally referred to as semiconductor devices.

Examples of specific constitutions of various apparatuses will be shown below. FIGS. 4A through 4F show examples of various semiconductor devices. These semiconductor devices use TFTs at least portions thereof.

Figure 4A:
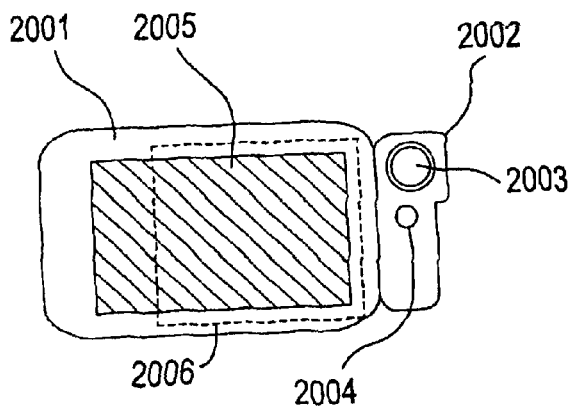
FIGS. 4A through 4F are views showing outlines of apparatuses using TFTs.

FIG. 4A shows an information processing terminal of a portable type. The information processing terminal is provided with a liquid crystal display of an active matrix type or an EL (Electro-luminescence) display of an active matrix type at a main body 2001 and is provided with a camera unit 2002 for taking information from outside. An integrated circuit 2006 is provided therein.

The camera unit 2002 is arranged with an image receiving unit 2003 and an operation switch 2004.

An information processing terminal is considered to become thinner and lighter in the future to promote the portability.

According to the constitution, it is preferable to integrate also peripheral drive circuit, operation circuit and memory circuit on a substrate formed with a display 2005 of an active matrix type by TFTs.

Figure 4B:
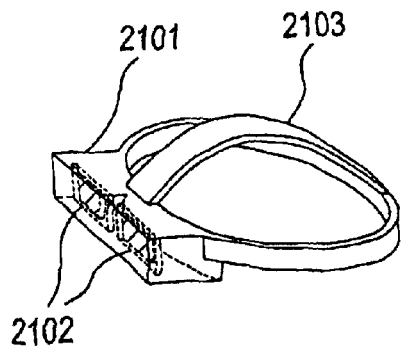

FIG. 4B shows a head mount display. The device is provided with a liquid crystal display or an EL display 2102 of an active matrix type at a main body 2101. Further, the main body 2101 can be mounted on the head by a band 2103.

Figure 4C:
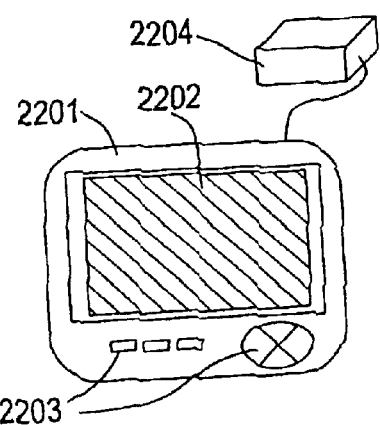

FIG. 4C shows a car navigation system. The device is provided with a function of receiving a signal from an artificial satellite by an antenna 2204 and displaying geographical information on a liquid crystal display 2202 of an active matrix type installed to a main body 2201 based on the signal.

A display device of an EL type can also be adopted as the display 2202. In any cases, the display is a flat panel display of an active matrix type utilizing TFTs.

Further, the main body 2201 is provided with operation switches 2203 whereby various operation can be carried out.

Figure 4D:
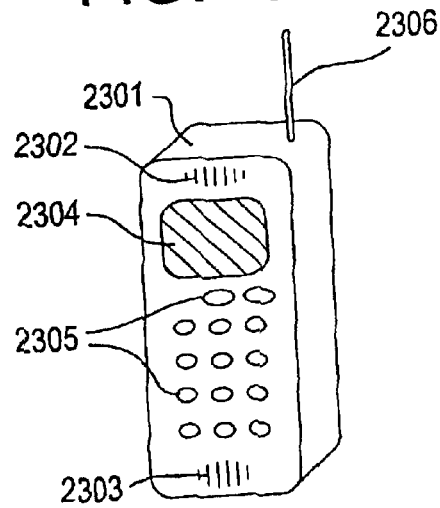

FIG. 4D shows a portable telephone. The device is provided with a liquid crystal display device 2304, operation switches 2305, a voice input unit 2303, a voice output unit 2302 and an antenna 2306 at a main body 2301.

In recent times, a constitution combining the portable type information processing terminal shown in FIG. 4A and the portable telephone shown in FIG. 4D is commercialized.

Figure 4E:
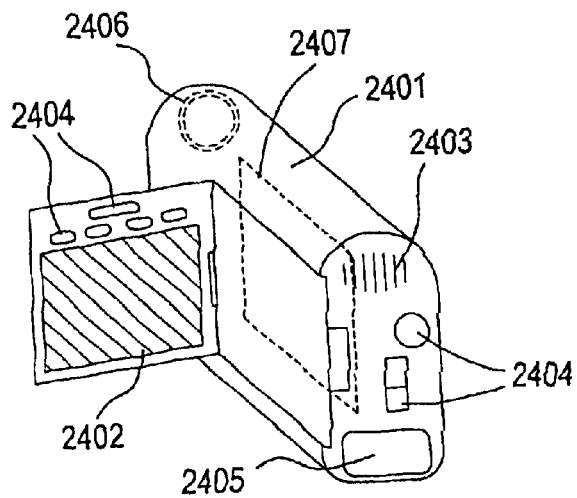

FIG. 4E shows a portable type video camera. The camera is provided with an image receiving unit 2406, a voice input unit 2403, operation switches 2404, a liquid crystal display 2402 of an active matrix type and a battery 2405 at a main body 2401.

Figure 4F:
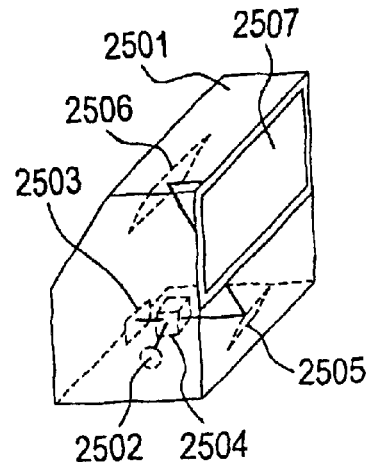

FIG. 4F shows a liquid crystal display device of a rear projection type. The constitution is provided with a structure having a screen for projection at a main body 2501. In the displaying operation, light from a light source 2502 is separated by a polarized beam splitter 2504, separated light is optically modulated by a liquid crystal display device 2503 of a reflecting type, and an image which has been optically modulated is reflected by reflectors 2505 and 2506 and is projected on a screen 2507.

In this case, an example of using a reflecting type of the liquid crystal display device 2503 has been shown. However, a liquid crystal display device of a transmitting type may be used here. In this case, an optical system may be changed.

(Embodiment 4)

The embodiment shows an example in the case where a film comprising $Si_xGe_{1-x}$ (0.5<X<1) is used in place of a silicon film in constitutions of other embodiments.

According to the present invention disclosed in the specification, a film comprising not only a single body of silicon but also a compound whose major component is silicon can be used. In this case, in the constitution of Embodiment 1, an amorphous film whose major component is silicon may be used in place of the amorphous silicon film mentioned before.

Further, a film whose major component is silicon is referred to a film including at least a half or more of silicon component.

For example, in the case of Embodiment 1, the amorphous silicon film 102 can be constituted by a film comprising $Si_xGe_{1-x}$ (0.5<X<1).

(Embodiment 5)

The embodiment shows an example in the case where a method of introducing nickel element is devised in the constitution shown in Embodiment 2.

According to the embodiment, a solution including nickel is held in contact with the surface of amorphous silicon film at the openings 303 and 304 in FIG. 3A.

Specifically, the portions of the openings 303 and 304 are masked by a resist or the like and phosphorus is doped to the region 308.

Further, masks at the portions of the openings 303 and 304 are removed and the region of the opening 308 is separately masked by a silicon oxide film or the like.

Under the state, a solution of nickel acetate is coated. Thereby, a state where nickel is held in contact with the surface of the amorphous silicon film is provided at the openings 303 and 304.

Next, by carrying out a heating treatment, crystal growth shown in FIG. 3D is carried out.

Although in this case, an example of using a solution is shown as a method of introducing nickel, otherwise, a method of forming a nickel film or a film including nickel by a sputtering process or a CVD process may be adopted.

(Embodiment 6)

The embodiment shows an example in the case where in the fabrication steps shown in Embodiment 1, a step of removing nickel element from the silicon film is further added.

According to the embodiment, a glass substrate is used as the substrate 101 in the fabrication steps shown in FIGS. 1A through 1E.

Further, after finishing to getter nickel in respect of the region 109 where phosphorus is doped shown in FIG. 1C, the heating step is carried out in an atmosphere including 97 volume % of oxygen and 3 volume % of HCl. The heating step is carried out under conditions of 950° C. and 30 minutes. Other than HCl, for example, POCl₃ gas can be used.

In this case, nickel element is vaporized in a state of nickel chloride from the film and is removed to outside.

In this way, nickel element can be removed from inside of the silicon film to outside. Successively, the silicon film is patterned as shown in FIG. 1D and TFTs are fabricated.

(Embodiment 7)

The embodiment shows an example in the case where in the fabrication steps shown in Embodiment 1, a thermally oxidizing step is used in the step of fabricating the gate insulating film which is the step shown in FIG. 1E.

In this embodiment, a glass substrate is used as the substrate 101. Further, in the step shown in FIG. 1E, after forming the silicon oxide film 114 by a plasma CVD process, a thermally oxidized film is further formed on the surface of the activation layer pattern by a thermally oxidizing process.

In this case, after forming the silicon oxide film 114 by a thickness of 30 nm, a heating treatment in an atmosphere including 97 volume % of oxygen and 3 volume % of HCl is carried out under conditions of 950° C. and 30 minutes.

In this case, the thermally oxidized film grows to a thickness of 30 nm. In this way, the thermally oxidized film having a thickness of 60 nm is formed.

Thereby, a state of an interface between the activation layer and the gate insulating film can be improved and TFTs having excellent properties can be provided.

According to the present invention disclosed in the specification, the following constitutions are basically adopted.

(1) A source for diffusing a catalyst element for promoting crystallization of an amorphous silicon film and a site for gettering the catalyst element are selectively formed in the amorphous silicon film.

(2) In crystallizing the amorphous silicon film, the crystallization is carried out by moving the catalyst element from the source of diffusion to the side of gettering.

(3) The source for diffusion and the site for gettering are removed and a region which has been crystallized in accordance with passage of the catalyst element is used as an activation layer.

In this way, in TFT fabricated by using a crystalline silicon film provided by utilizing a catalyst element promoting crystallization of semiconductor, adverse influence of the catalyst element can be restrained from effecting on properties thereof.

Further, the present invention disclosed in the specification is featured in that the above-described effects can be achieved in simplified fabrication steps.

What is claimed is:

1. A method of manufacturing a semiconductor device comprising:

forming an amorphous film comprising silicon and germanium;

providing said amorphous film with a material comprising a metal for promoting crystallization of said amorphous film;

heating said amorphous film provided with said material to crystallize said amorphous film, thereby, forming a crystallized film;

removing said material from the crystallized film by gettering.

2. The method according to claim 1 wherein said metal is selected from the group consisting of Fe, Co, Ni, Ru, Rh, Pd, Os, Ir, Pt, Cu, Au, Ge, Pb, In.

3. The method according to claim 1 wherein said semiconductor device is a flat panel display.

4. The method according to claim 1 wherein said semiconductor device is selected from the group consisting of an information processing terminal, a head mount display, a car navigation system, a portable telephone, a portable video camera and a projector.

5. The method according to claim 1 wherein said amorphous film comprises $Si_xGe_{1-x}$ (0.5<x<1).

6. A method of manufacturing a semiconductor device comprising:

forming an amorphous film comprising silicon and germanium;

providing a selected portion of said amorphous film with a material comprising a metal for promoting crystallization of said amorphous film;

heating said amorphous film provided with said material to crystallize said amorphous film, thereby, forming a crystallized film wherein crystallization proceeds laterally from said selected to a portion;

removing said material from the crystallized film by gettering.

7. The method according to claim 6 wherein said metal is selected from the group consisting of Fe, Co, Ni, Ru, Rh, Pd, Os, Ir, Pt, Cu, Au, Ge, Pb, In.

8. The method according to claim 6 wherein said semiconductor device is a flat panel display.

9. The method according to claim 6 wherein said semiconductor device is selected from the group consisting of an information processing terminal, a head mount display, a car navigation system, a portable telephone, a portable video camera and a projector.

10. The method according to claim 6 wherein said amorphous film comprises $Si_xGe_{1-x}$ ($0.5<x<1$).

11. A method of manufacturing a semiconductor device comprising:

forming an amorphous film comprising silicon and germanium;

providing said amorphous film with a material comprising a metal for promoting crystallization of said amorphous film;

heating said amorphous film provided with said material to crystallize said amorphous film, thereby, forming a crystallized film;

removing said material from the crystallized film by gettering;

patterning said crystallized film to form at least one semiconductor island; and forming a gate electrode adjacent to the semiconductor island with a gate insulating film interposed therebetween.

12. The method according to claim 11 wherein said metal is selected from the group consisting of Fe, Co, Ni, Ru, Rh, Pd, Os, Ir, Pt, Cu, Au, Ge, Pb, In.

13. The method according to claim 11 wherein said semiconductor device is a flat panel display.

14. The method according to claim 11 wherein said semiconductor device is selected from the group consisting of an information processing terminal, a head mount display, a car navigation system, a portable telephone, a portable video camera and a projector.

15. The method according to claim 11 wherein said amorphous film comprises $Si_xGe_{1-x}$ ($0.5<x<1$).

16. A method of manufacturing a semiconductor device comprising:

forming an amorphous film comprising silicon and germanium;

providing a selected portion of said amorphous film with a material comprising a metal for promoting crystallization of said amorphous film;

heating said amorphous film provided with said material to crystallize said amorphous film, thereby, forming a crystallized film wherein crystallization proceeds laterally from said selected to a portion;

removing said material from the crystallized film by gettering;

patterning said crystallized film to form at least one semiconductor island; and forming a gate electrode adjacent to the semiconductor island with a gate insulating film interposed therebetween.

17. The method according to claim 16 wherein said metal is selected from the group consisting of Fe, Co, Ni, Ru, Rh, Pd, Os, Ir, Pt, Cu, Au, Ge, Pb, In.

18. The method according to claim 16 wherein said semiconductor device is a flat panel display.

19. The method according to claim 16 wherein said semiconductor device is selected from the group consisting of an information processing terminal, a head mount display, a car navigation system, a portable telephone, a portable video camera and a projector.

20. The method according to claim 16 wherein said amorphous film comprises $Si_xGe_{1-x}$ ($0.5<x<1$).

* * * * *